(12) United States Patent
Ruggiero

(10) Patent No.: US 9,960,580 B1
(45) Date of Patent: May 1, 2018

(54) UNIVERSAL ELECTRICAL BOX

(71) Applicant: Alexander Ruggiero, Manalapan, NJ (US)

(72) Inventor: Alexander Ruggiero, Manalapan, NJ (US)

( * ) Notice: Subject to any disclaimer, the term of this patent is extended or adjusted under 35 U.S.C. 154(b) by 993 days.

(21) Appl. No.: 13/859,730

(22) Filed: Apr. 10, 2013

(51) Int. Cl.
*H05K 7/14* (2006.01)
*H02G 3/08* (2006.01)

(52) U.S. Cl.
CPC ............. *H02G 3/081* (2013.01); *H05K 7/14* (2013.01)

(58) Field of Classification Search
USPC .................................................. 174/53, 559
See application file for complete search history.

(56) References Cited

U.S. PATENT DOCUMENTS

| | | | |
|---|---|---|---|
| 3,140,425 A | 7/1964 | Cade | |
| 3,443,162 A | 5/1969 | Nudelmont | |
| 3,609,647 A * | 9/1971 | Castellano | 439/535 |
| 3,617,612 A | 11/1971 | Patton | |
| 3,716,651 A | 2/1973 | Werner | |
| 4,165,443 A | 8/1979 | Figart et al. | |
| 4,295,018 A * | 10/1981 | Borrelli | 200/51.09 |
| 4,336,418 A | 6/1982 | Hoag | |
| 4,958,048 A * | 9/1990 | Bell | 174/53 |
| 5,471,012 A | 11/1995 | Opel | |
| 6,558,190 B1 * | 5/2003 | Pierson, Jr. | 439/535 |
| 6,843,680 B2 * | 1/2005 | Gorman | 439/535 |
| 7,160,147 B1 * | 1/2007 | Stephan | 439/535 |
| 7,459,631 B2 * | 12/2008 | Nakayama et al. | 174/50 |
| 7,837,483 B2 * | 11/2010 | Haut et al. | 439/131 |
| 8,124,872 B2 * | 2/2012 | Vigorito et al. | 174/50 |
| 2002/0185296 A1 * | 12/2002 | Schultz et al. | 174/53 |
| 2003/0159850 A1 * | 8/2003 | McCarthy | 174/211 |
| 2009/0107693 A1 * | 4/2009 | Meyer | 174/60 |

\* cited by examiner

*Primary Examiner* — C. Smith
*Assistant Examiner* — Jessey R Ervin

(57) ABSTRACT

An assembly that simplifies the wiring of switches, receptacles and other such termination devices within a junction box. The present invention utilizes a dielectric body having a front surface and a side surface. The dielectric body is sized to fit within the electrical junction box. Side connector ports are disposed on the side surface of the dialectic body. A termination device is present at the front surface of the dielectric body. Conductive elements extend through the dielectric body and connect the termination device to the side connector ports. As such, electrical power is provided to the termination device through the side connector ports and the conductive elements that pass through the dielectric body.

17 Claims, 4 Drawing Sheets

UNIVERSAL ELECTRICAL BOX

BACKGROUND OF THE INVENTION

1. Field of the Invention

The present invention relates to systems and devices for the interconnection of wires to receptacles, switches or other such termination devices within junction boxes. More particularly, the present invention relates to the structure of the wire connection system and the manner in which it connects to wires and termination devices within the confines of a junction box.

2. Prior Art Description

Most building codes require that all connections between wires, switches, receptacles and/or any other hardwired component be contained within some form of fire retardant junction box. Traditionally, such junction boxes are made of metal or polyvinylchloride (PVC). Such junction boxes contain various punch-out structures that enable a variable number of wires to be led into the junction box. During rough construction, the junction boxes are mounted within various walls of the building. The wires are then run between the junction boxes. At this point, most building codes require that the rough wiring be inspected. The rough wiring inspection checks to see that the rough wiring is properly anchored in the walls, the junction boxes are properly positioned, only ground wires interconnect, and that no one junction box receives too many wires.

After the rough wiring is inspected, the walls of the building are typically finished with drywall. Various termination devices, such as receptacles, switches, lighting fixtures and the like are then connected to the wires within the junction boxes. This work is typically done by an electrician.

For low-set junction boxes, an electrician typically must sit or kneel in front of the junction box in order to reach the short wires extending through the junction box. Likewise, for high-set junction boxes, an electrician must often stand upon a ladder or stool to reach the wires extending through the junction box. A typical building can contain scores of low-set and high-set junction boxes. As such, an electrician must expend a lot of labor repeatedly kneeling to reach low-set junction boxes and climbing to reach high-set junction boxes. After the various termination devices are connected to the wires within the junction boxes, a final inspection is conducted to ensure that the various termination devices are properly installed and function as designed.

Depending upon the circuit design being installed by an electrician, it is common for various wires to be directly interconnected within a junction box. Such wire-to-wire connections are traditionally made using wire nuts. To make such a connection, wires are twisted together in front of a junction box. The twisted wires are capped with a wire nut. The wire nut and the wires are then bent back into the confines of the junction box. However, as the wires are manipulated back into the junction box, sometimes the wires separate under the wire nut and the connection fails. An electrician must then inspect all the connections in the circuit to discover where the break has occurred.

To complicate matters, wire connections often cannot be readily observed within the confines of a junction box. Wires connected to a receptacle or switch are blocked from view behind the receptacle or switch. Likewise, wires connected together with a wire nut behind a switch or receptacle are also blocked from view. As such, a separated connection is often impossible to determine by visually inspecting the junction boxes. Rather, the only way to fix the problem is to open and remove the contents of all of the junction boxes in the failed circuit until the faulty connection is identified.

Over the years, many devices have been invented in an attempt to simplify the wiring of difficult types of electrical termination devices. However, these prior art devices are typically application specific, and can only be used as either a switch box or as a receptacle box. Prior art devices that show simplified receptacle boxes are exemplified by U.S. Pat. No. 3,716,651 to Werner, entitled Minimum Wire Box And Device Adapters; U.S. Pat. No. 4,165,443 to Figart, entitled Power Distribution System and U.S. Pat. No. 4,336,418 to Hoag, entitled Laminated Junction Box Module And Laminated Plug-In Accessory Modules Selectively Usable Therein. Such prior art devices do not require wire nuts to connect wires. However, special outlet terminals must be used making the overall systems much more expensive than traditional junction box systems.

Examples of prior art junction boxes are shown in U.S. Pat. No. 3,443,162 to Nudelmont, entitled Current Distributor; U.S. Pat. No. 3,140,425 to Cade, entitled Electrical Connector Apparatus; and U.S. Pat. No. 3,617,612 to Patton, entitled Electrical Junction Means. Each of these junction boxes eliminates the need for wire nuts. However, these junction boxes contain custom manufactured internal components. Thus, the junction boxes are more complex to use and more costly than traditional junction boxes.

U.S. Pat. No. 5,471,012 to Opel, entitled Electrical Wire Box Apparatus also discloses a junction box construction that eliminates the need for wire nuts. However, in the Opel patent, as with all the other referenced prior art patents, the wire terminations are at the rear of the junction box and are hidden from view. As such, the number of wires entering the box, the quality of the connections, and the paths of interconnections cannot be visually observed without disassembly and removal of the components within the junction box.

A need therefore exists for a system and method of connecting wires to receptacles, switches and other termination devices within a junction box, yet enables the wires and terminations within the junction box to be readily observed within a fully assembled application. A need also exists for a system and method for connecting wires in a junction box that reduces the need for an electrician to bend and climb during the installation process. These needs are met by the present invention as described and claimed below.

SUMMARY OF THE INVENTION

The present invention is an assembly that simplifies the wiring of switches, receptacles and other such termination devices within a junction box. The present invention utilizes a dielectric body having a front surface and a side surface. The dielectric body is sized to fit within the electrical junction box through an opening in the top of the electrical junction box.

A plurality of side connector ports are disposed on the side surface of the dialectic body. These side connector ports connect to wires that enter and leave the junction box.

A termination device is present at the front surface of the dielectric body. The termination device may be manufactured as part of the dielectric body or may be a removable plug-in unit. The termination device is a receptacle, switch, or similar device.

A plurality of conductive elements extend through the dielectric body and connect the termination device to the side connector ports. As such, electrical power is provided to the termination device through the side connector ports and the conductive elements that pass through the dielectric body.

BRIEF DESCRIPTION OF THE DRAWINGS

For a better understanding of the present invention, reference is made to the following description of exemplary embodiments thereof, considered in conjunction with the accompanying drawings, in which.

DETAILED DESCRIPTION OF THE DRAWINGS

Although the present invention connecting system can be embodied in many ways, the embodiments illustrated show the connecting system in its simplest embodiment for use in a single-gang junction box. These embodiments are selected in order to set forth the clearest manner to describe the invention. The illustrated embodiments, however, are merely exemplary and should not be considered a limitation when interpreting the scope of the appended claims.

Figure 1:
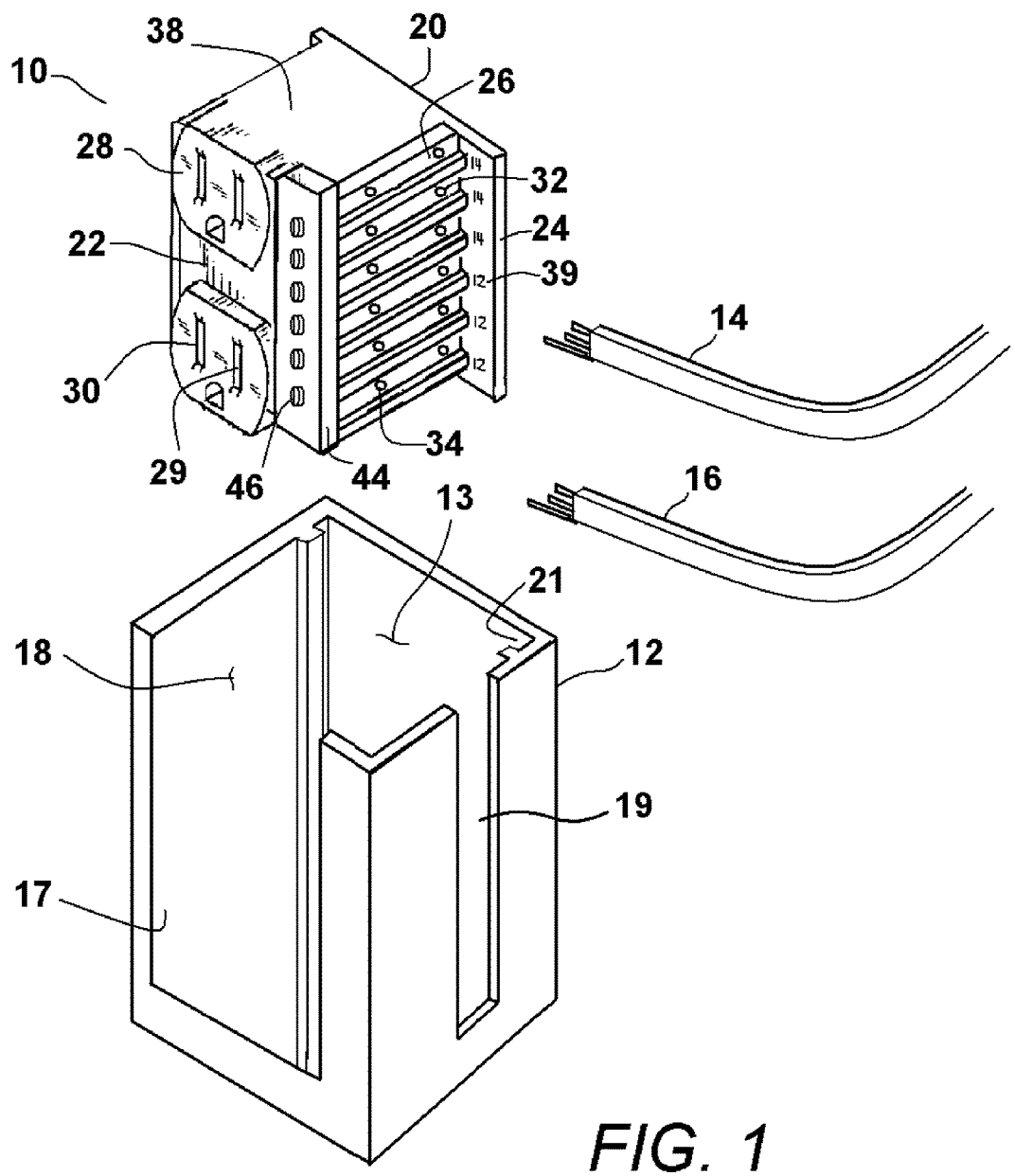
FIG. 1 is an exploded perspective view of an exemplary embodiment of the present invention wire connection system.
Figure 2:
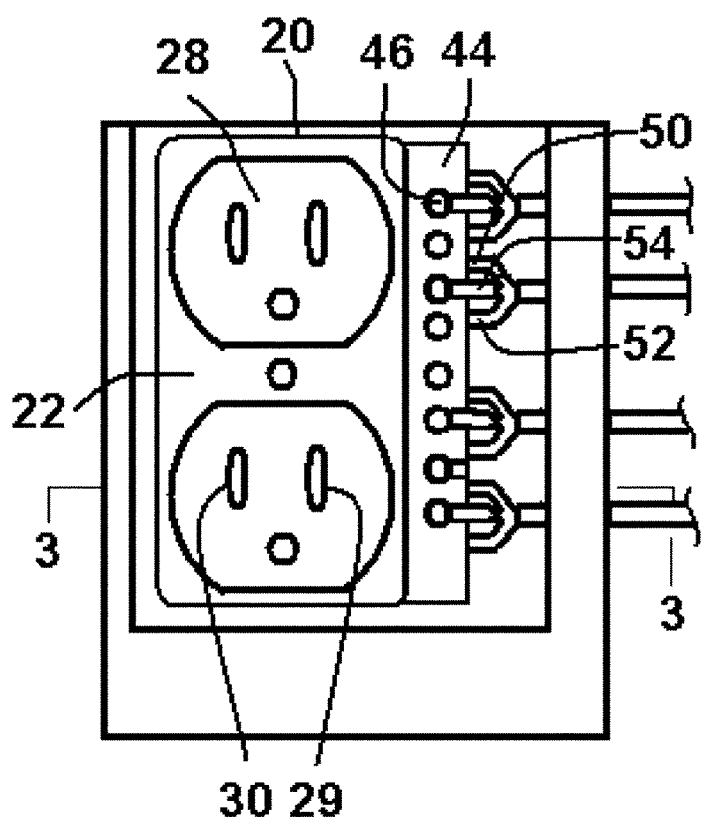
FIG. 2 is a front view of the embodiment of FIG. 1 when fully assembled.
Figure 3:
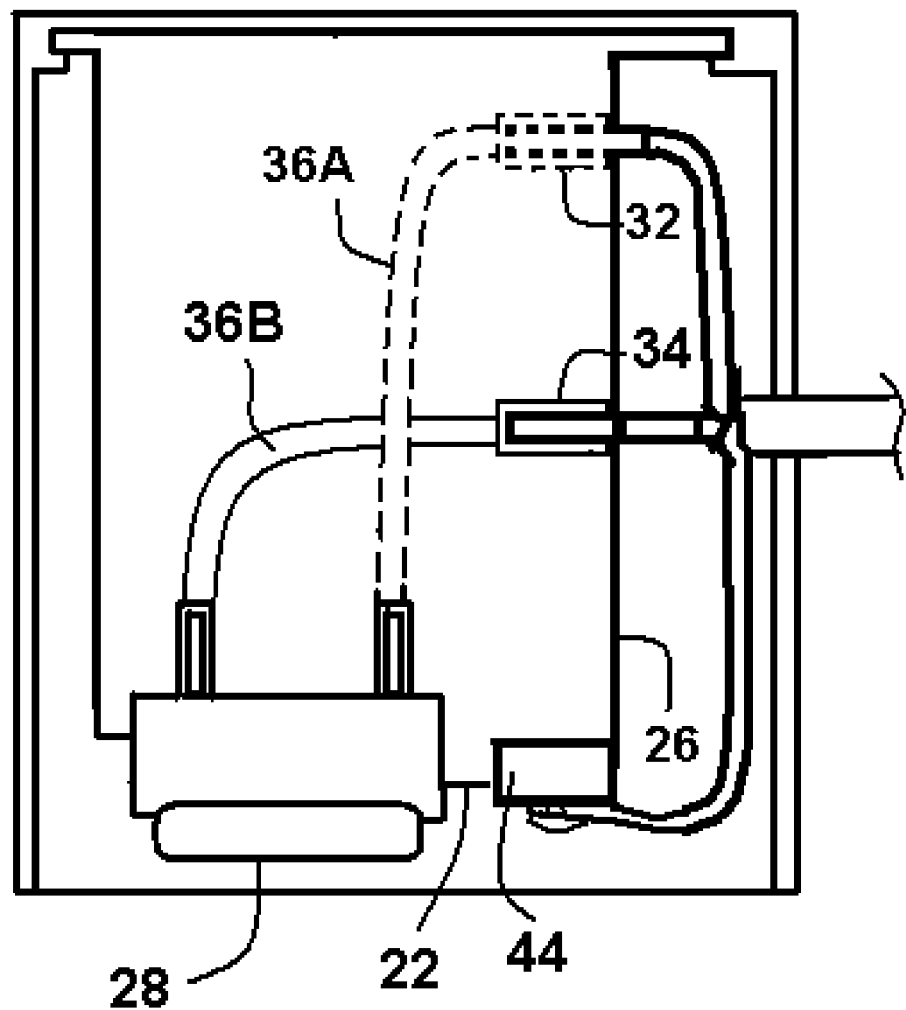
FIG. 3 is a cross-sectional view of the embodiment of FIG. 2 viewed along section line 3-3.

Referring to FIG. 1 in conjunction with FIG. 2 and FIG. 3, a first embodiment of the present invention connecting system 10 is shown. The connecting system 10 includes a junction box 12 and a connector block assembly 20.

In the shown embodiment, two sets of wires 14, 16 enter the junction box 12. Two of the sets of wires 14, 16 are standard gauge wires and may be either 12-gauge wires or 14-gauge wires. The purpose of the wire connecting system 10 is to electrically join the sets of wires 14, 16 to the connector block assembly 20.

The junction box 12 defines an open interior space 18. The junction box has a top opening 13, a front opening 17 and wire openings that all provide access to the interior space 18. The wire openings can be standard junction box openings. However, in the shown embodiment, a side opening 19 is provided to accommodate the sets of wires 14, 16. Guide tracks 21 are formed into the junction box 12 for a purpose that is later described.

The connector block assembly 20 has a length, width and height that enables the connector block assembly 20 to pass into the interior space 18 of the junction box 12 through the top opening 13.

The connector block assembly 20 has a front panel 22, a rear panel 24, and a side panel 26 that extends between the front panel 22 and the rear panel 24.

A termination device 28, such as a switch or a receptacle is incorporated into the front panel 22 of the connector block assembly 20. In the shown embodiment, the termination device 28 is a dual port receptacle. As such, the termination device 28 has a power receptacle ports 29 and neutral receptacle ports 30. The power receptacle ports 29 are electrically interconnected within the structure of the termination device 28, in the same manner as prior art receptacles.

Vertical columns of connector ports are disposed on the side panel 26. The vertical columns include at least one column of power ports 32, and at least one column of neutral ports 34.

Each of the power receptacle ports 29 on the termination device 28 is electrically interconnected with a corresponding power port 32 on the side panel 26 using an internal conductive element 36A. The conductive element 36A extends through the otherwise dielectric body 38 of the connector block assembly 20. Likewise, each of the neutral receptacle ports 30 on the termination device 28 is electrically interconnected with a corresponding neutral port 34 on the side panel 26 using a conductive element 36B. The conductive elements 36B extend through the otherwise dielectric body 38 of the connector block assembly 20.

Each power port 32 and each neutral port 34 on the side panel 26 is capable of receiving a bare wire of a particular gauge. In the shown embodiment, some of the power ports 32 and some of the neutral ports 34 are for 12-gauge wire, others are for 14-gauge wire. Indicators 39 for gauge size are presented on the rear panel 24.

Each power port 32 and each neutral ground port 34 may optionally have internal engagement clips that enable the various ports to mechanically engage any wire of the proper gauge that is pressed into those ports.

A conductive grounding bus 44 is attached to the dielectric body 38 adjacent the front panel 22. The grounding bus 44 contains front wire attachment posts 46. The grounding bus 44 is electrically isolated from all of the power ports 32 and neutral ports 34.

In the shown embodiment, each of the sets of wires 14, 16 is a traditional three-wire set that contains a black wire 50, a neutral wire 52, and a bare ground wire 54. The wire connecting system 10 is used to interconnect the black wires 50, neutral wires 52, and bare ground wires 54 between selected wire sets, via the structure of the connector block assembly 20.

To utilize the present invention system 10, the various sets of wires 14, 16 that are to be connected are stripped at the ends in the traditional manner. The connector block assembly 20 is then provided. The black wires 50 from the first set of wires 14 and the second set of wires 16 are then connected to power ports 32 on the side panel 26. The black wires 50 from both sets of wires 14, 16 therefore become electrically interconnected with the power receptacle ports 29 on the termination device 28 by the conductive elements 36A within the connector block assembly 20.

Likewise, the neutral wires 52 from the first set of wires 14 and the second set of wires 16 are connected to neutral ports 34 on the side panel 26. The neutral wires 52 from both sets of wires 14, 16 therefore become electrically interconnected with the neutral receptacle ports 30 on the termination device 28 via the conductive elements 36B within the connector block assembly 20.

Lastly, the bare ground wires 54 from both sets of wires 14, 16 are connected to the grounding bus 44. The result is that power and ground is provided to the termination device 28, of the connector block assembly. Furthermore, the three wires of the first set of wires 14 are electrically connected to the three wires of the second set of wires 16 through the structure of the connector block assembly 20. In this manner, electrical circuits can be propagated from wire to wire if so required.

Since the sets of wire 14, 16 attach to the connector block assembly 20 away from the junction boxes, an electrician can reach the sets of wires 14, 16 from a low-set junction box without knelling. Likewise, an electrician can reach the sets of wires 14, 16 from a high-set junction box. Once the sets of wires 14, 16 are connected to the connector block assembly 20, the electrician can then just slip the pre-wired connector block assembly 20 into its junction box 12.

Once all the sets of wires 14, 16 are attached to the connector block assembly 20, the wired connector block assembly 20 is then set into place within the junction box 12. This is done by sliding the connector block assembly 20 into the guide tracks 21 of the junction box 12 through the top opening 13 of the junction box 12. Furthermore, as is best shown by FIG. 2, when the wired connector block assembly 20 is in the junction box 12, all the wires 50, 52, 54 from all sets of wires 14, 16 can be readily observed. In this manner, using a simple visual inspection, a person can see how many sets of wires are present within a junction box 12 and how those wires are interconnected.

Figure 4:
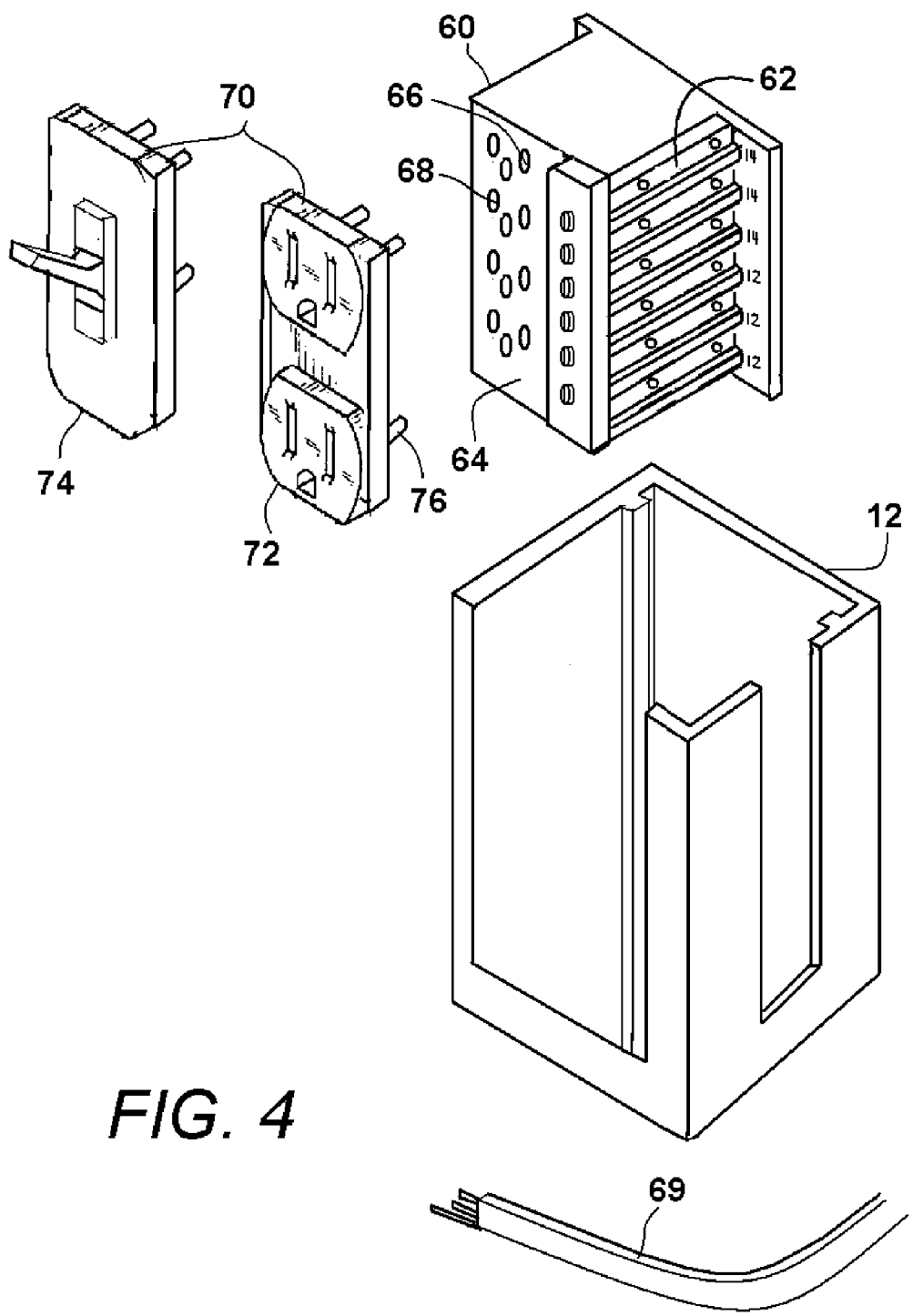
FIG. 4 is an exploded perspective view of an alternate embodiment of the present invention wire connection system.

In the embodiment shown, the termination device 28 is configured as part of the conductive block assembly 20. However, this need not be the case. Referring now to FIG. 4, it can be seen that the present invention system can be configured so that the termination devices are separate and distinct from the connector block assembly.

In the example of FIG. 4, the junction box 12 is the same as was previously described. However, a modified connector block assembly 60 is provided. The modified connector block assembly 60 has the same side panel 62 as was previously described. However, the modified connector block assembly 60 also contains a generic front panel 64. A matrix of power ports 66 and neutral ports 68 are present on the front panel 64. The ports on the front panel interconnect with corresponding ports on the side panel 62 using the conductive elements that pass through the connector block assembly.

A set of wires 69 extends into the junction box 12 and attaches to the side panel 62 of the modified connector block assembly 60 in the same manner as was previously described with the first exemplary embodiment. The generic front panel 64 is left blank.

A separate termination device 70, such as the switch 74 or the receptacle 72, is provided. Although only a switch 74 and receptacle 72 are illustrated, it should be understood that the termination device 70 can be a night light, a dimmer switch, a timer switch or any other such object that is traditionally connected directly to a junction box.

The termination device 70 is a custom object that contains wire shaped posts 76. The posts 76 plug into the ports 66, 68 on the front panel 64 of the connector block assembly 60. The wires from the set of wires 69 connect to the side panel 62 at ports that correspond to the ports on the front panel 64 that receive the posts 76. In this way, the termination device 70 is electrically connected to the set of wires 69 and is provided with electrical power.

It will be understood that the embodiments of the present invention that are illustrated and described are merely exemplary and that a person skilled in the art can make many variations to those embodiments. For instance, the number and position of ports on the front panel and side panel of the connector block assembly can be changed in many ways. Likewise, the size of the connector block assembly can be increased or decreased to fit junction boxes of different sizes. All such embodiments are intended to be included within the scope of the present invention as defined by the claims.

What is claimed is:

1. An assembly comprising:
   a junction box having a front opening;
   a dielectric body having a front surface and a side surface, wherein said dielectric body is sized to fit within said electrical junction box;
   a plurality of side connector ports disposed on said side surface, said connector ports including a first vertical column of power ports and a second vertical column of neutral ports, wherein each of said power ports is positioned at a different elevation along said first vertical column and each of said neutral ports is positioned at a different elevation along said second vertical column, wherein at least some of said plurality of side connectors receive wire sets and said wire sets are received at different elevations along said first vertical column and said second vertical column that are observable through said front opening of said junction box;
   a termination device coupled to said front surface of said dielectric body, wherein said termination device is selected from a group consisting of a receptacle and a switch; and
   a plurality of conductive elements that extend through said dielectric body and connect said termination device to said plurality of side connector ports, wherein electrical power is provided to said termination device through said plurality of side connector ports.

2. The assembly according to claim 1, wherein said termination device plugs into said dielectric body, therein enabling said termination device to be selectively pulled away and separated from said dielectric body.

3. The assembly according to claim 2, wherein said front surface of said dielectric body contains a plurality of front connector ports, wherein at least some of said plurality of front connector ports connect to said termination device.

4. The assembly according to claim 3, wherein each of said plurality of front connector ports is electrically connected to a corresponding one of said plurality of side connector ports by said plurality of conductive elements.

5. The assembly according to claim 1, wherein said junction box has an open top surface and said dielectric body passes into said junction box through said open top surface.

6. The assembly according to claim 5, wherein said junction box contains internal tracks that receive and retain said dielectric body within said junction box.

7. The assembly according to claim 1, further including a conductive ground strip coupled to said dielectric body, wherein said conductive ground strip is electrically isolated from said plurality of side connector ports and said plurality of conductive elements.

8. The assembly according to claim 1, wherein at least some of said plurality of side connector ports are sized to receive wire of different gauges.

9. An assembly comprising:
   a junction box that defines an interior space accessible through a front opening in said junction box;
   sets of wires entering said junction box and terminating within said interior space;
   a dielectric body positioned within said junction box, said dielectric body having a front surface and a side surface;
   a plurality of front connector ports disposed on said front surface of said dielectric body, wherein said plurality of front connector ports face said front opening of said junction box;
   a plurality of side connector ports disposed on said side surface of said dielectric body, said plurality of connector ports including a first vertical column of power ports and a second vertical column of neutral ports, wherein each of said power ports is positioned at a different elevation along said first vertical column and each of said neutral ports is positioned at a different elevation along said second vertical column, wherein said sets of wires are connected to said at least some of said plurality of side connector ports at different elevations along said first vertical column and said second vertical column, therein enabling said sets of wires to be directly observable through said front opening of said junction box; and a plurality of conductive elements that extend through said dielectric body and connect said front connector ports to said plurality of side connector ports, therein electrically interconnecting said sets of wires to said plurality of front connector ports within said junction box.

10. The assembly according to claim 9, wherein each of said plurality of conductive elements is electrically isolated from others of said plurality of conductive elements and, wherein each of said plurality of conductive elements connects only one of said front connector ports to one of said plurality of side connector ports.

11. The assembly according to claim 9, further including a conductive ground strip coupled to said dielectric body.

12. The assembly according to claim 9, further including a termination device that selectively plugs into said plurality of front connector ports.

13. The assembly according to claim 12, wherein said termination device is selected from a group consisting of switches and receptacles.

14. The assembly according to claim 9, wherein junction box has an open top surface and said dielectric body passes into said junction box through said open top surface.

15. The assembly according to claim 14, wherein said junction box contains internal tracks that receive and retain said dielectric body within said junction box.

16. An assembly comprising:
a junction box that defines an interior space accessible through a front opening in said junction box;
a first set of wires entering said junction box and terminating within said interior space;
a dielectric body positioned within said junction box, said dielectric body having a front surface and a side surface;
a universal set of front connector ports disposed on said front surface of said dielectric body, wherein said front connector ports face said front opening of said junction box and are configured to receive and electrically interconnect with a selected one of a plurality of different auxiliary electrical components, wherein said plurality of different auxiliary electrical components are selected from a group consisting of switches and receptacles;
a plurality of side connector ports disposed vertically on said side surface of said dielectric body, wherein said first set of wires is connected to said at least some of said plurality of side connector ports; and
a plurality of conductive elements that extend through said dielectric body and connect said plurality of front connector ports to said plurality of side connector ports, therein electrically interconnecting said first set of wires to said selected one of said auxiliary electrical components.

17. The assembly according to claim 16, wherein said auxiliary electrical components have conductive posts extending therefrom that plug into said plurality of front connector ports.

* * * * *